(12) United States Patent
Yang et al.

(10) Patent No.: US 12,175,907 B2
(45) Date of Patent: Dec. 24, 2024

(54) DISPLAY WITH A TRANSMITTER UNDER AN ACTIVE AREA

(71) Applicant: Apple Inc., Cupertino, CA (US)

(72) Inventors: Shyuan Yang, San Jose, CA (US); Cheng-Chih Hsieh, Santa Clara, CA (US); Jonathan H Beck, San Francisco, CA (US); Yuchi Che, Santa Clara, CA (US); Tsung-Ting Tsai, San Jose, CA (US); Warren S Rieutort-Louis, Cupertino, CA (US); Abbas Jamshidi Roudbari, Saratoga, CA (US); Ting-Kuo Chang, San Jose, CA (US); Shih Chang Chang, Cupertino, CA (US); Bhadrinarayana Lalgudi Visweswaran, San Mateo, CA (US); Jae Won Choi, San Jose, CA (US); Kyounghwan Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/476,892

(22) Filed: Sep. 28, 2023

(65) Prior Publication Data
US 2024/0194106 A1 Jun. 13, 2024

Related U.S. Application Data

(60) Provisional application No. 63/476,578, filed on Dec. 21, 2022, provisional application No. 63/431,453, filed on Dec. 9, 2022.

(51) Int. Cl.
*G09G 3/20* (2006.01)
*H10K 59/131* (2023.01)

(52) U.S. Cl.
CPC ............ *G09G 3/20* (2013.01); *H10K 59/131* (2023.02); *G09G 2300/0452* (2013.01);
(Continued)

(58) Field of Classification Search
CPC ............ G09G 3/20; G09G 2300/0452; G09G 2300/0465; G09G 2320/0233; G09G 2320/0242; H10K 59/131
See application file for complete search history.

(56) References Cited

U.S. PATENT DOCUMENTS 4,928,301 A 5/1990 Smoot
6,977,705 B1 12/2005 Chiang et al.
(Continued)

FOREIGN PATENT DOCUMENTS

CN 111554227 A 8/2020
KR 20220051377 A 4/2022
(Continued)

OTHER PUBLICATIONS

Andrew Maimone et al., Computational Augmented Reality Eyeglasses, IEEE International Symposium on Mixed and Augmented Reality (ISMAR), Oct. 2013, IEEE, New York, New York, United States.

*Primary Examiner* — Premal R Patel
(74) *Attorney, Agent, or Firm* — Treyz Law Group, P.C.; Joseph F. Guihan; Jinie M. Guihan

(57) ABSTRACT

A light emitter that operates through a display may cause display artifacts, even when the light emitter operates using non-visible wavelengths. To mitigate artifacts caused by a light emitter operating through a display, the display may have a higher density of thin-film transistor sub-pixels than emissive sub-pixels. This allows for a region in the display to include emissive sub-pixels but be free of thin-film transistor sub-pixels. The light emitter may operate through this region in the display. Additionally, to reduce the amount of space occupied in the inactive area of a display by gate driver circuitry, at least a portion of the gate driver circuitry may be positioned in the active area of the display. To
(Continued)

accommodate the gate driver circuitry, emissive sub-pixels may be laterally shifted relative to corresponding thin-film transistor sub-pixels.

23 Claims, 18 Drawing Sheets

(52) U.S. Cl.
CPC .............. *G09G 2300/0465* (2013.01); *G09G 2320/0233* (2013.01); *G09G 2320/0242* (2013.01)

(56) References Cited

U.S. PATENT DOCUMENTS

| | | | |
|---|---|---|---|
| 8,179,381 | B2 | 5/2012 | Frey et al. |
| 8,284,332 | B2 | 10/2012 | Geaghan et al. |
| 8,345,129 | B2 | 1/2013 | Kanade et al. |
| 9,341,846 | B2 | 5/2016 | Popovich et al. |
| 9,519,154 | B2 | 12/2016 | Bell |
| 10,268,884 | B2 | 4/2019 | Jones et al. |
| 10,394,189 | B2 | 8/2019 | Futterer |
| 2007/0075935 | A1 | 4/2007 | Mesmer et al. |
| 2008/0165267 | A1 | 7/2008 | Cok |
| 2010/0224880 | A1 | 9/2010 | Kimura |
| 2012/0300307 | A1 | 11/2012 | Borrelli et al. |
| 2017/0117342 | A1 | 4/2017 | Kwon |
| 2018/0052276 | A1 | 2/2018 | Klienman et al. |
| 2018/0204895 | A1 | 7/2018 | Lin et al. |
| 2019/0041658 | A1 | 2/2019 | Gollier et al. |
| 2019/0207155 | A1 | 7/2019 | Lee et al. |
| 2019/0250450 | A1 | 8/2019 | Li |
| 2019/0319222 | A1 | 10/2019 | Gunji et al. |
| 2019/0377858 | A1 | 12/2019 | He et al. |
| 2021/0151425 | A1* | 5/2021 | Kim ........................ H04N 23/55 |
| 2021/0191552 | A1 | 6/2021 | Bok et al. |
| 2022/0165814 | A1 | 5/2022 | Rieutort-Louis et al. |
| 2022/0189410 | A1* | 6/2022 | Kim ..................... G09G 3/3266 |
| 2022/0209124 | A1 | 6/2022 | Nakamura et al. |
| 2022/0376029 | A1* | 11/2022 | Huang ................ H10K 59/131 |
| 2023/0309353 | A1* | 9/2023 | Jin ........................ H01L 27/124 |
| 2024/0130193 | A1* | 4/2024 | Park ..................... H10K 59/352 |

FOREIGN PATENT DOCUMENTS

| | | |
|---|---|---|
| WO | 2020219267 A1 | 10/2020 |
| WO | 2021188217 A1 | 9/2021 |

* cited by examiner

DISPLAY WITH A TRANSMITTER UNDER AN ACTIVE AREA

This application claims priority to U.S. provisional patent application No. 63/431,453, filed Dec. 9, 2022, and U.S. provisional patent application No. 63/476,578, filed Dec. 21, 2022, which are hereby incorporated by reference herein in their entireties.

BACKGROUND

This relates generally to electronic devices, and, more particularly, to electronic devices with displays.

Electronic devices often include displays. For example, an electronic device may have a light-emitting diode (LED) display based on light-emitting diode pixels. In this type of display, each pixel includes a light-emitting diode and circuitry for controlling application of a signal to the light-emitting diode to produce light.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack.

It is within this context that the embodiments herein arise.

SUMMARY

An electronic device may include a plurality of pixels arranged in a light-emitting area. Each one of the plurality of pixels may include an emissive sub-pixel and a thin-film transistor sub-pixel that controls the emissive sub-pixel, the emissive sub-pixels may have a first number of emissive sub-pixels per unit area, the thin-film transistor sub-pixels may have a second number of thin-film transistor sub-pixels per unit area, and the second number may be greater than the first number. The electronic device may also include a region in the plurality of pixels that includes a first subset of the emissive sub-pixels and is free of any thin-film transistor sub-pixels and a light source that emits light through the region in the plurality of pixels.

A display may include a plurality of pixels arranged in a light-emitting area. The light-emitting area may have rounded corners, each one of the plurality of pixels may include an emissive sub-pixel and a thin-film transistor sub-pixel that controls the emissive sub-pixel, and the emissive sub-pixels may have a uniform density across the light-emitting area. The display may also include a plurality of data lines, a plurality of gate lines, display driver circuitry that is configured to provide data to the plurality of pixels using the plurality of data lines, and gate driver circuitry that is configured to provide control signals to the plurality of pixels using the plurality of gate lines. In a first subset of rows of the emissive sub-pixels that includes the rounded corners, the emissive sub-pixels may overlap the gate driver circuitry along an edge of the light-emitting area. In a second subset of rows of the emissive sub-pixels that does not include the rounded corners, the emissive sub-pixels may not overlap the gate driver circuitry along the edge of the light-emitting area.

An electronic device may include a display comprising a plurality of pixels arranged in a light-emitting area, each one of the plurality of pixels including an emissive sub-pixel and a thin-film transistor sub-pixel that controls the emissive sub-pixel and the emissive sub-pixels having a uniform density across the light-emitting area, and a proximity sensor comprising a light source that emits light through a portion of the plurality of pixels that is free of thin-film transistor sub-pixels.

DETAILED DESCRIPTION

Figure 1:
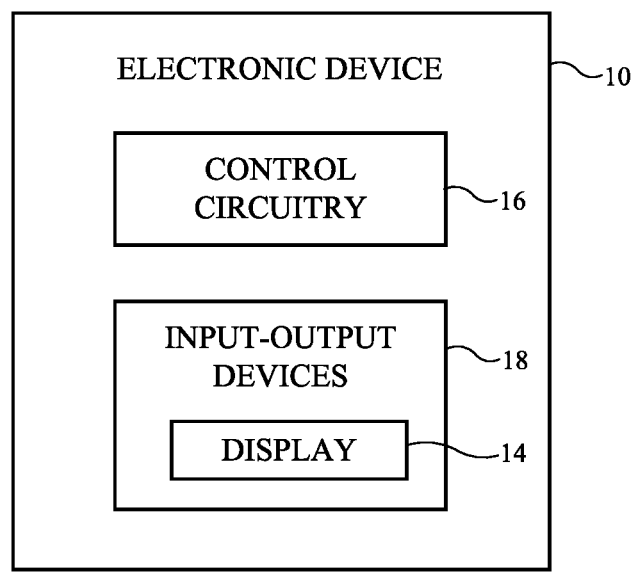
FIG. 1 is a schematic diagram of an illustrative electronic device having a display in accordance with some embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, an augmented reality (AR) headset and/or virtual reality (VR) headset, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be an organic light-emitting diode display, a display formed from an array of discrete light-emitting diodes each formed from a crystalline semiconductor die, or any other suitable type of display. Configurations in which the pixels of display 14 include light-emitting diodes are sometimes described herein as an example. This is, however, merely illustrative. Any suitable type of display may be used for device 10, if desired (e.g., a liquid crystal display).

In some cases, electronic device 10 may be a wristwatch device. Display 14 of the wristwatch device may be positioned in a housing. A wristwatch strap may be coupled to the housing.

Figure 2:
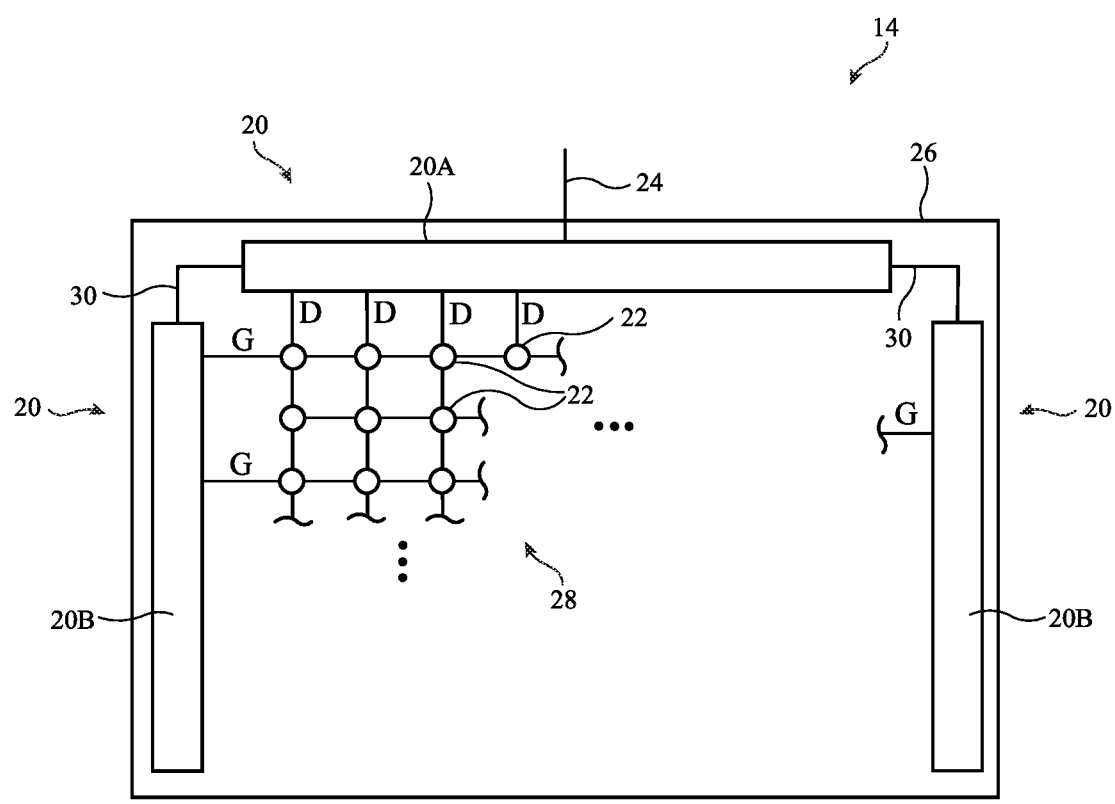
FIG. 2 is a schematic diagram of an illustrative display in accordance with some embodiments.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 (sometimes referred to as active area 28) may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. If desired, a backlight unit may provide backlight illumination for display 14.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 in an inactive area of the display as shown in FIG. 2. Gate driver circuitry 20B may include gate drivers and emission drivers.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, the control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D (e.g., vertical signal lines) while issuing control signals to supporting display driver circuitry such as gate driver circuitry 20B over signal paths 30. With the illustrative arrangement of FIG. 2, data lines D run vertically through display 14 and are associated with respective columns of pixels 22. During compensation operations, column driver circuitry 20 may use paths such as data lines D to supply a reference voltage.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.). The number of horizontal signal lines in each row may be determined by the number of transistors in the display pixels 22 that are being controlled independently by the horizontal signal lines. Display pixels of different configurations may be operated by different numbers of control lines, data lines, power supply lines, etc.

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Figure 3:
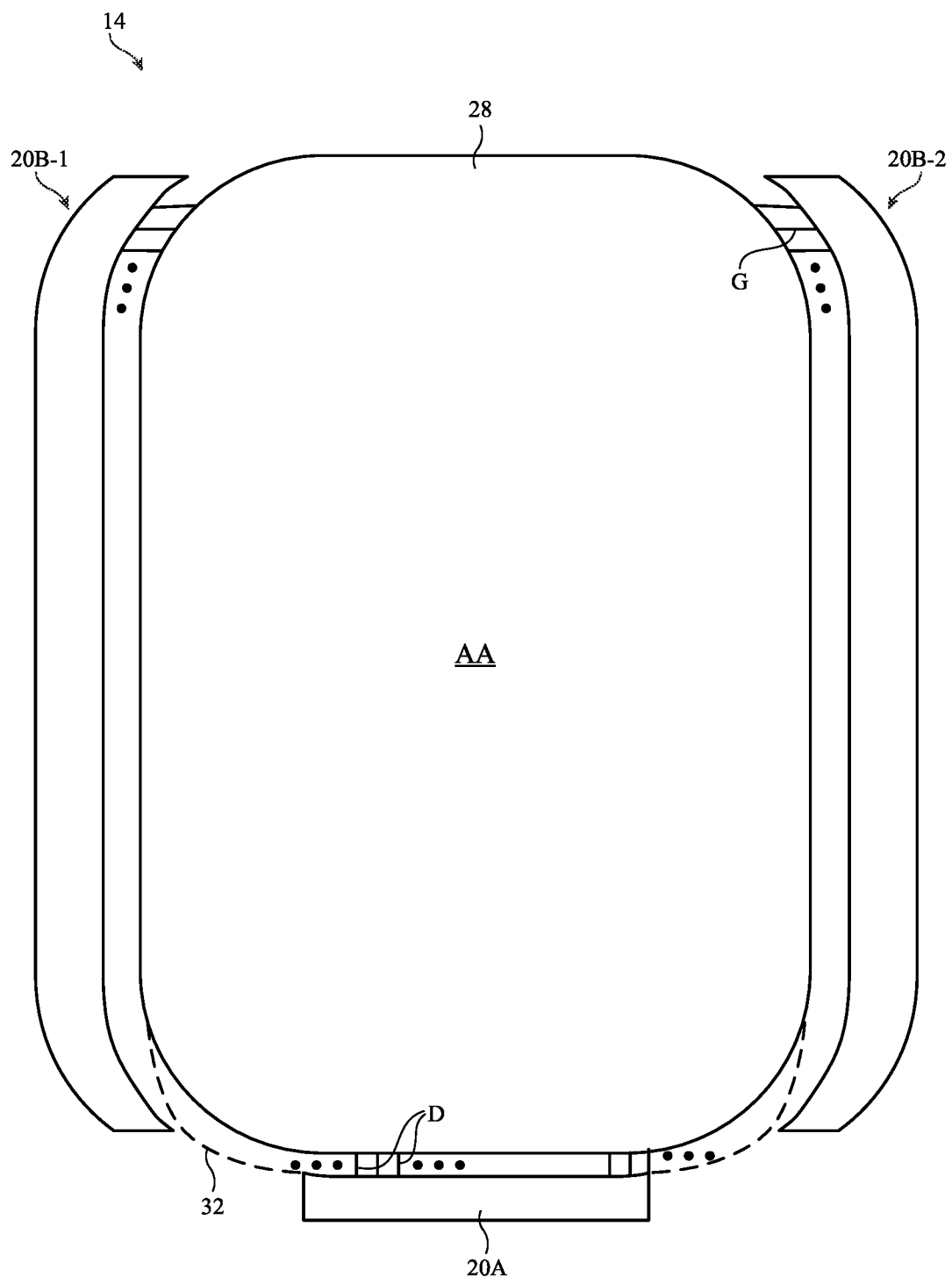
FIG. 3 is a top view of an illustrative display having gate driver circuitry on both sides of the display in accordance with some embodiments.

FIG. 3 shows a top view of an illustrative display with gate driver circuitry. Gate driver circuitry 20B may be formed along one or more edges of display 14. FIG. 3 shows an example where gate driver circuitry 20B is formed on first and second opposing sides of pixel array 28 (sometimes referred to as an active area AA). In other words, first gate driver circuitry 20B-1 is formed on the left side of the active area AA and second gate driver circuitry 20B-2 is formed on the right side of the active area AA.

Gate driver circuitry 20B-1 and 20B-2 may be configured to supply control signals to each pixel in the display. For example, gate driver circuitry 20B-1 and 20B-2 may supply control signals such as scanning control signals and emission control signals to the gates of transistors within each pixel. Gate driver circuitry 20B-1 and 20B-2 may each contain a shift register formed from a chain of register circuits. Each register circuit may supply control signals (e.g., switching transistor control signals, emission enable signals, etc.) to a corresponding row of pixels. During operation, control circuitry 16 (e.g., display driver circuitry 20A) may initiate propagation of a control pulse through the shift register. As the control pulse propagates through the shift register, each gate line may be activated in sequence, allowing successive rows of pixels 22 to be loaded with data from data lines D. Each register circuit may be referred to as a stage of the shift register.

In the example of FIG. 3, active area AA has a rectangular shape with rounded corners. This example is merely illustrative and in general the active area may have any desired shape.

As shown, the display also includes display driver circuitry 20A. Display driver circuitry 20A may supply corresponding image data to data lines D (e.g., vertical signal lines). Each data line D may be coupled to a respective column of pixels within the pixel array 28. However, as shown in FIG. 3, the width of display driver circuitry 20A may be less than the width of the active area AA. Accordingly, in order to provide data to all of the pixel columns, a fanout region 32 is used. In the fanout region, data lines D are spread out from display driver circuitry 20A to reach all of the columns in the pixel array. With the data line fanout region, the data lines are coupled to pixel columns in the rounded corner areas of the display.

In the arrangement of FIG. 3, gate driver circuitry 20B-1 and 20B-2 and data line fanout region 32 are all formed in the inactive area of the display. The inactive area of the display is an area of the display without pixels. The inactive area of the display therefore does not emit light. In general, it may be desirable to minimize the size of the inactive area of the display (e.g., to allow the active area of the display to occupy a maximum amount of relative area of the front face of the device). The gate driver circuitry 20B-1 and 20B-2 and data line fanout region 32 therefore undesirably increase the required size of the inactive area of the display.

Figure 4:
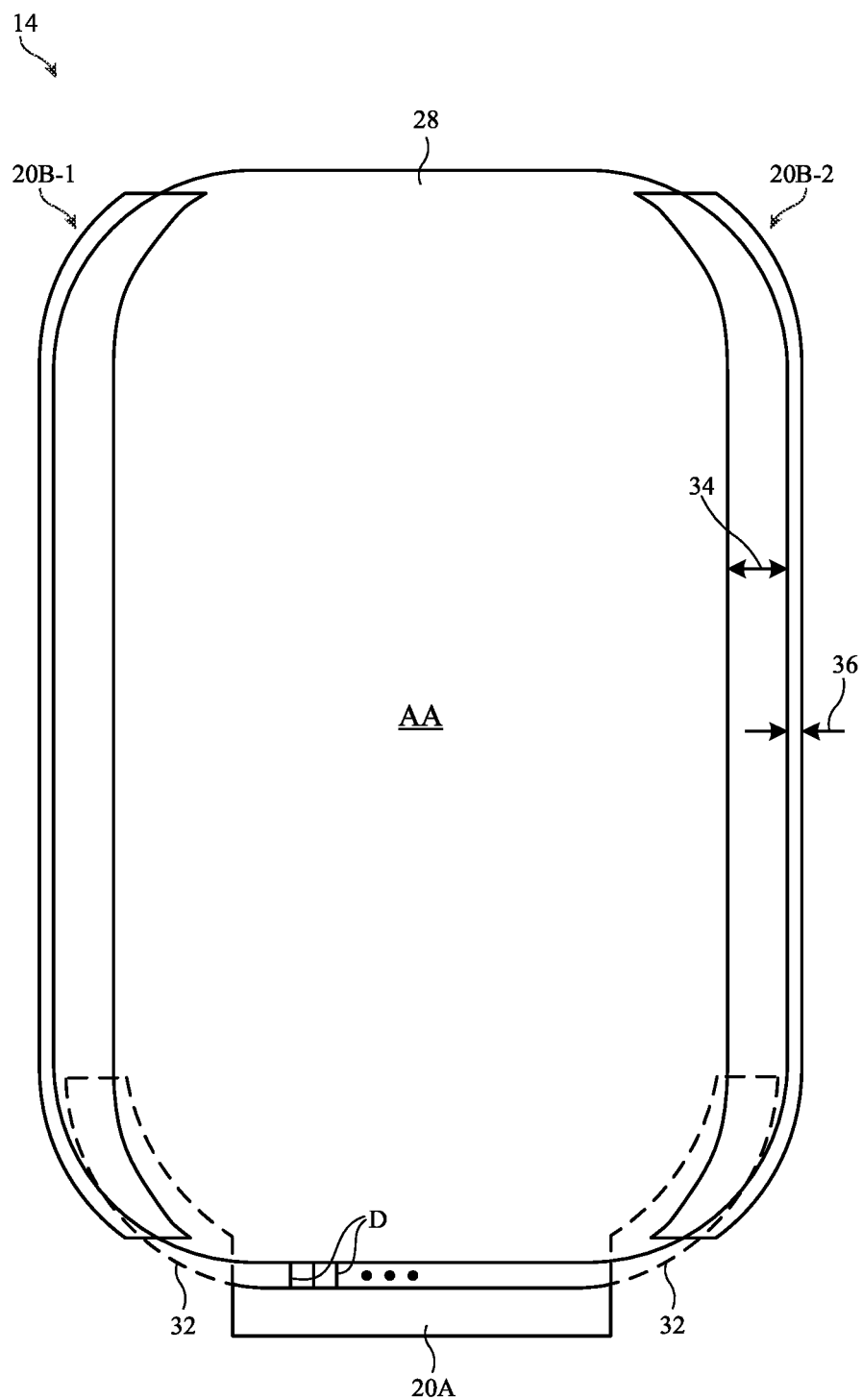
FIG. 4 is a top view of an illustrative display having gate driver circuitry in a light-emitting area of the display in accordance with some embodiments.

To reduce the size of the inactive area, gate driver circuitry 20B-1, gate driver circuitry 20B-2, and/or data line fanout region 32 may be at least partially formed in the active area of the display. FIG. 4 is a top view of an illustrative display with gate driver circuitry 20B-1, gate driver circuitry 20B-2, and data line fanout region 32 formed in active area AA. As shown, gate driver circuitry 20B-2 extends into active area AA by distance 34 along the right edge of the active area. In other words, the right edge of active area AA overlaps gate driver circuitry 20B-2 (e.g., the active area may at least partially overlap a shift register included in gate driver circuitry 20B-2).

As shown in FIG. 4, gate driver circuitry 20B-2 may be partially but not entirely formed in active area AA. The gate driver circuitry 20B-2 has a portion with a width 36 that is formed in the inactive area of the display. In general, distances 34 and 36 may have any desired magnitudes. Distance 34 may be at least 50 microns, at least 100 microns, at least 150 microns, at least 200 microns, at least 300 microns, at least 500 microns, at least 600 microns, less than 750 microns, less than 300 microns, etc. Distance 36 may be at least 50 microns, at least 100 microns, at least 150 microns, at least 200 microns, at least 300 microns, at least 500 microns, at least 600 microns, less than 750 microns, less than 300 microns, etc.

Similar to gate driver circuitry 20B-2, gate driver circuitry 20B-1 extends into active area AA along the left edge of the active area. Instead or in addition, data line fanout region 32 may be formed in the active area AA in the rounded corner areas of the active area (e.g., the lower left rounded corner and/or the lower right rounded corner).

To accommodate the components formed in the active area such as gate driver circuitry (such as circuitry 20B-1 or 20B-2) and/or data lines (e.g., in the data line fanout region), the pixel array may be modified. In particular, there may be a higher density of thin-film transistor sub-pixels in the display than emissive sub-pixels to provide additional space for the gate driver circuitry and/or data lines. This technique to allow components such as gate driver circuitry and/or data lines to be formed in the active area is described in more detail in connection with FIGS. 5-6.

Each display pixel 22 may include both a thin-film transistor layer and an emissive layer. Each emissive layer portion may have associated circuitry on the thin-film transistor layer that controls the magnitude of light emitted from that emissive layer portion. The emissive layer may include anodes for the pixels, OLED layers for the pixels, pixel definition layers for the pixels, etc. Both the emissive layer and thin-film transistor layer may have corresponding sub-pixels within the pixel. Each sub-pixel may be associated with a different color of light (e.g., red, green, and blue). The emissive layer portion for a given sub-pixel does not necessarily need to have the same footprint as its associated thin-film transistor layer portion. Hereinafter, the term sub-pixel may sometimes be used to refer to the combination of an emissive layer portion and a thin-film transistor layer portion. Additionally, the thin-film transistor layer may be referred to as having thin-film transistor sub-pixels (e.g., a portion of the thin-film transistor layer that controls a respective emissive area, sometimes referred to as thin-film transistor layer pixels, thin-film transistor layer sub-pixels or simply sub-pixels) and the emissive layer may be referred to as having emissive layer sub-pixels (sometimes referred to as emissive pixels, emissive sub-pixels or simply sub-pixels).

Figure 5A:
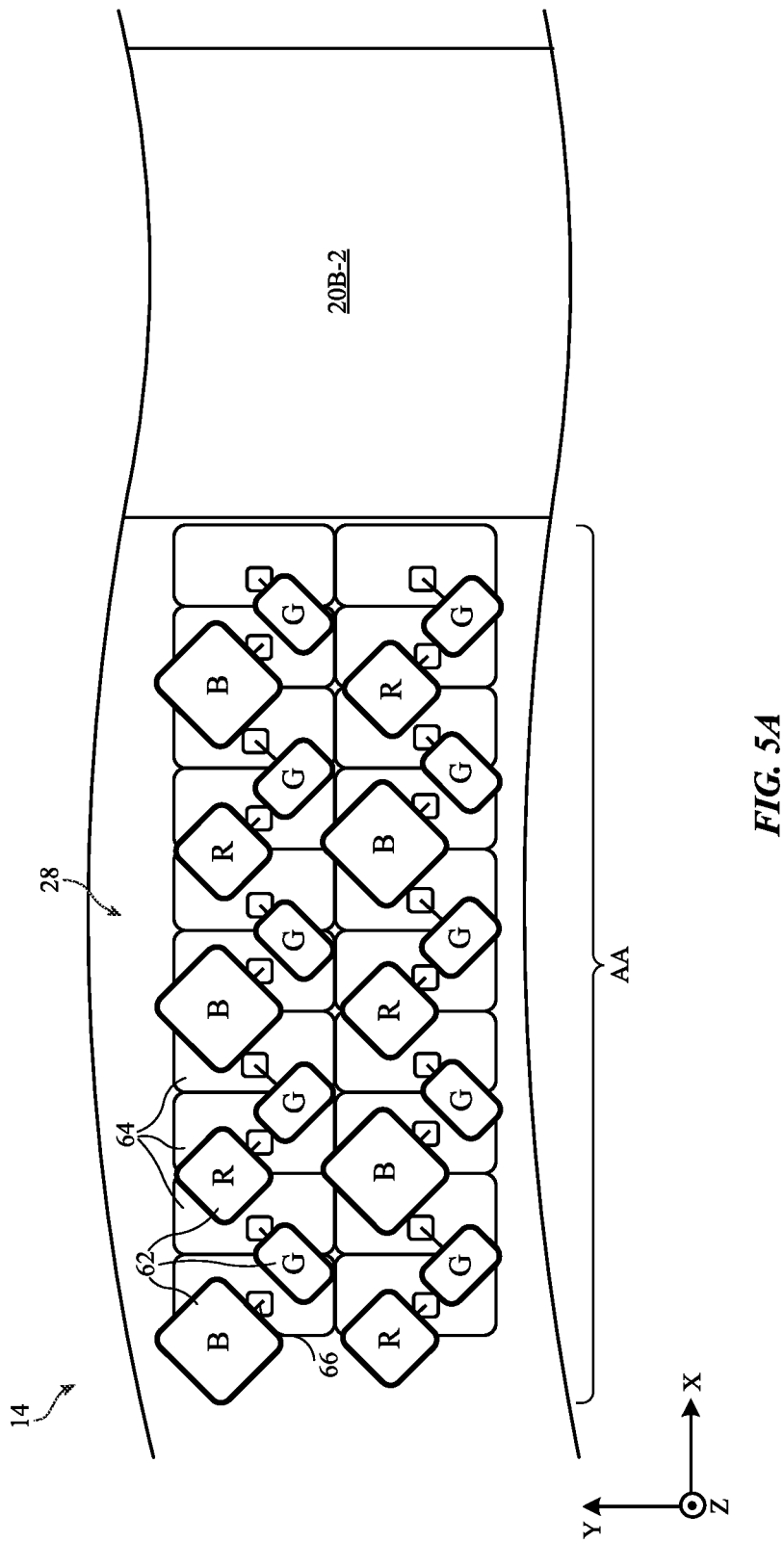
FIG. 5A is a top view of an illustrative display having emissive sub-pixels that overlap respective thin-film transistor sub-pixels in accordance with some embodiments.

FIG. 5A is a top view of an illustrative pixel array of the type shown in FIG. 3. In FIG. 5A, active area AA includes a pixel array that has the same pattern up to the edge of the active area. Outside the active area, gate driver circuitry 20B-2 is formed.

As shown in FIG. 5A, the pixel array 28 includes emissive sub-pixels 62 such as red (R), green (G), and blue (B) emissive sub-pixels 62. Each emissive sub-pixel 62 has a corresponding thin-film transistor sub-pixel 64. A contact 66 is shown for each thin-film transistor sub-pixel demonstrating how the thin-film transistor sub-pixel is electrically connected to a respective emissive sub-pixel. In FIG. 5A, each thin-film transistor sub-pixel 64 controls one corresponding emissive sub-pixel that overlaps that thin-film transistor sub-pixel.

Figure 5B:
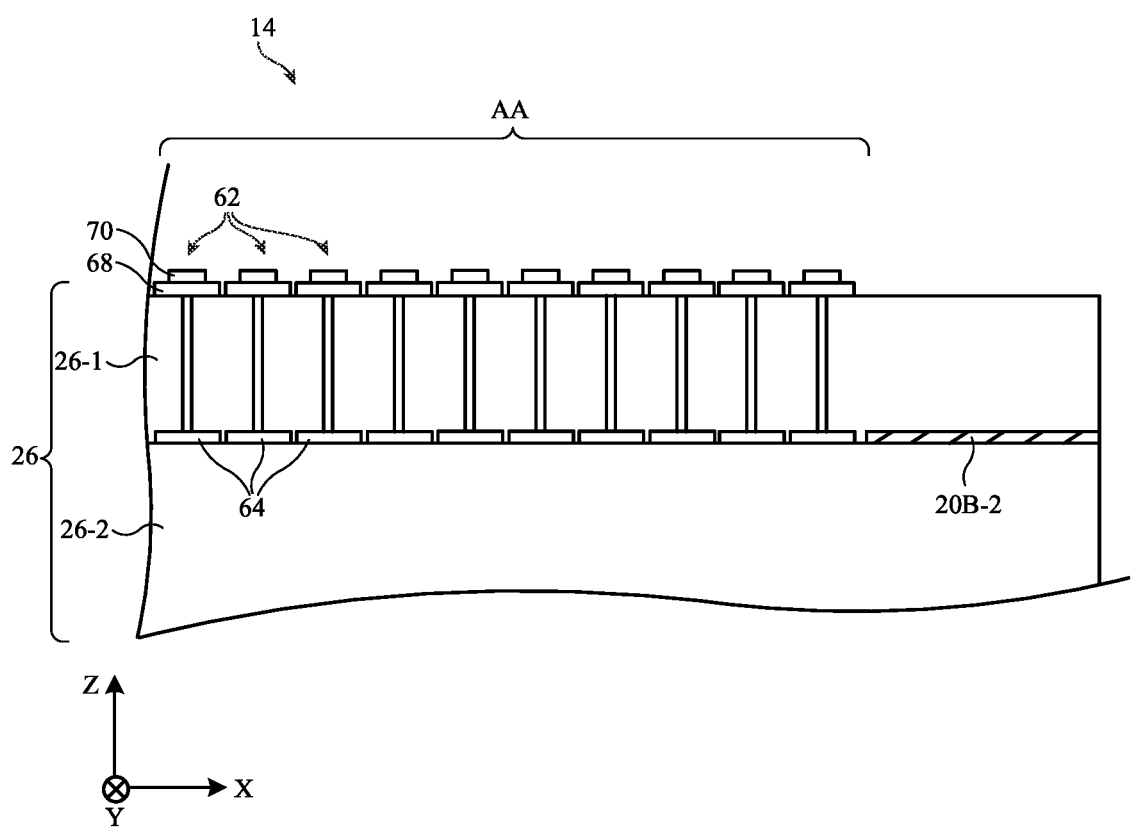
FIG. 5B is a cross-sectional side view of an illustrative display having emissive sub-pixels that overlap respective thin-film transistor sub-pixels in accordance with some embodiments.

FIG. 5B is a cross-sectional side view of the display shown in FIG. 5A. As shown in FIG. 5B, thin-film transistor sub-pixels 64 are formed within substrate 26. Substrate 26 may include one or more dielectric layers (such as layers 26-1 and 26-2) and metallization layers that form the thin-film transistor circuitry that operates the display. Thin-film transistor sub-pixels 64 are formed on dielectric layer 26-2. Each thin-film transistor sub-pixel is electrically connected to and controls a respective emissive sub-pixel 62. In the example of FIG. 5B, each emissive sub-pixel 62 includes a respective anode 68 and OLED layers 70 (e.g., a hole injection layer, hole transport layer, an emissive layer, a charge generation layer, an electron transport layer, an electron injection layer, etc.). This example is merely illustrative. In general, each emissive sub-pixel may be formed using any desired type of display technology (e.g., OLED, LED, LCD, etc.).

As shown in FIG. 5B, each emissive sub-pixel 62 vertically overlaps (e.g., in the Z-direction) a respective thin-film transistor sub-pixel 64 by which it is controlled. Outside the active area AA, gate driver circuitry 20B-2 is formed.

With the arrangement of FIGS. 5A and 5B, gate driver circuitry 20B is formed exclusively in the inactive area of the display (e.g., none of the gate driver circuitry is formed in the light-emitting active area).

In FIG. 5A, the display edge may be parallel to the X axis or the Y axis. The front face of the display may be parallel to the XY plane such that a user of the device views the front face of the display in the Z direction. In FIG. 5A, the sub-pixels are angled relative to the edges of the display (e.g., the edges of the sub-pixels are at non-zero, non-orthogonal angles relative to the X-axis and Y-axis). This example is merely illustrative. If desired, each individual subpixel may have edges parallel to the display edge.

Figure 6A:
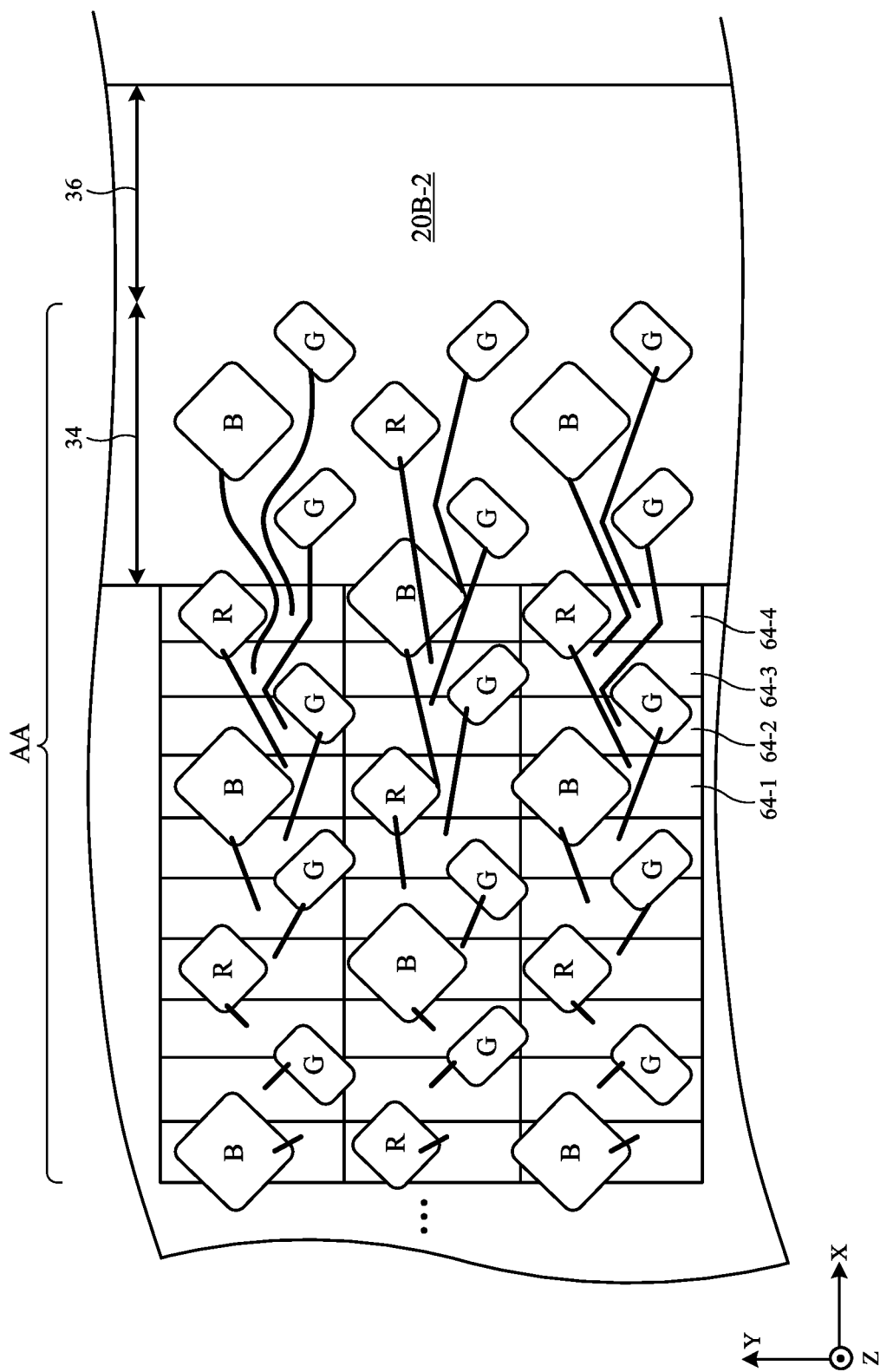
FIG. 6A is a top view of an illustrative display with some emissive sub-pixels that are shifted laterally relative to respective thin-film transistor sub-pixels in accordance with some embodiments.

In FIG. 6A, the thin-film transistor sub-pixels have a higher density (e.g., number of sub-pixels per unit area) than the emissive sub-pixels, which allows for gate driver circuitry such as gate driver circuitry 20B-2 to be formed in the active area.

As shown in FIG. 6A, the density of emissive sub-pixels is consistent across the active area AA. To accommodate a uniform emissive sub-pixel density across the display (while still having gate driver circuitry in the active area), the density of the thin-film transistor sub-pixels may be greater than the density of the emissive sub-pixels. The thin-film transistor sub-pixels therefore occupy a smaller footprint than the emissive sub-pixels. The thin-film transistor sub-pixels may be consolidated in a central portion of the active area, resulting in an area at the periphery of the active area where emissive sub-pixels can overlap gate driver circuitry.

The emissive sub-pixels in FIG. 6A may be arranged with a first density (e.g., number of emissive sub-pixels per unit area). The density of the emissive sub-pixels may be characterized by pixels per inch (PPI) or any other desired unit. The thin-film transistor sub-pixels in FIG. 6A may be arranged with a second density (e.g., number of thin-film transistor sub-pixels per unit area) that is greater than the first density (e.g., by at least 0.1%, by at least 0.5%, by at least 1%, by at least 2%, by at least 3%, by at least 5%, by at least 10%, etc.).

Figure 6B:
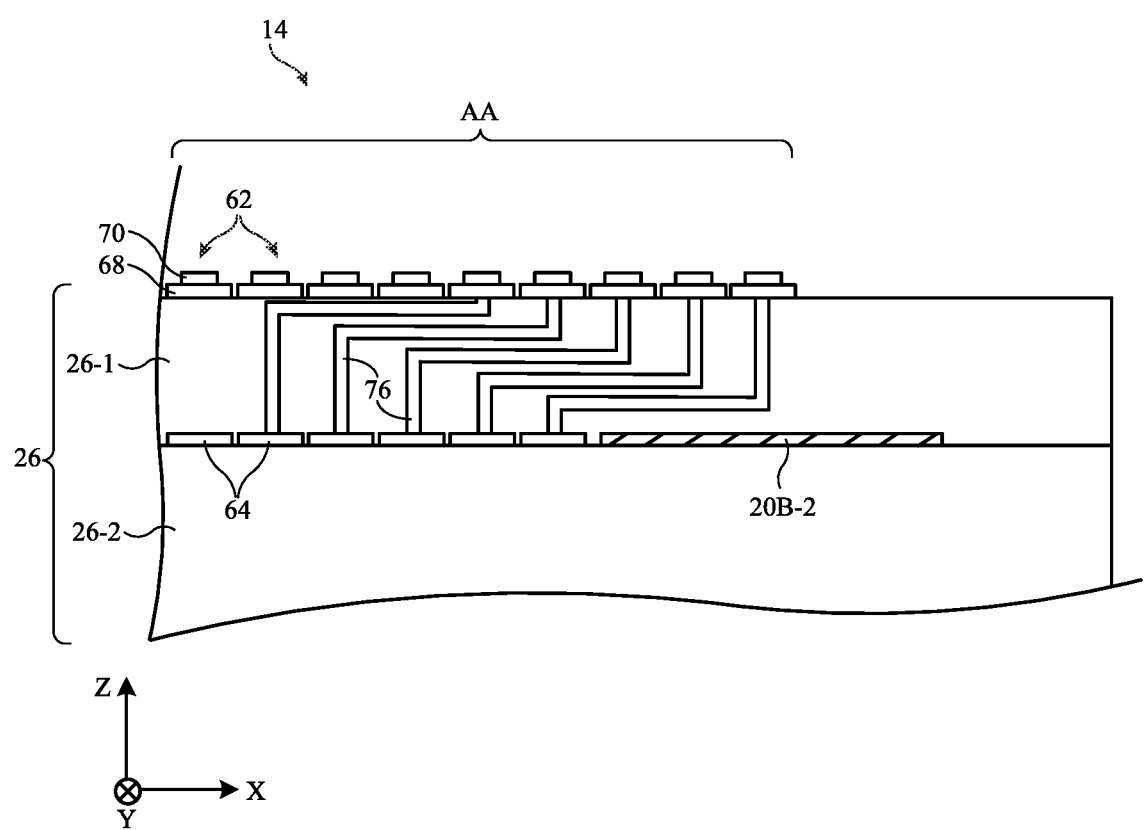
FIG. 6B is a cross-sectional side view of an illustrative display with some emissive sub-pixels that are shifted laterally relative to respective thin-film transistor sub-pixels in accordance with some embodiments.

In the arrangement of FIG. 6A, the emissive sub-pixels in active area AA do not necessarily vertically overlap their respective thin-film transistor sub-pixels. As shown in FIG. 6B, each emissive sub-pixel may be electrically connected to its respective thin-film transistor sub-pixel by a respective conductive path 76. The conductive path may include one or more traces and one or more vias in the display substrate. The conductive path allows for the position of the emissive sub-pixel to be decoupled from the position of the thin-film transistor sub-pixel. This allows for the positions of the thin-film transistor sub-pixels and the positions of the emissive sub-pixels to be optimized independently, improving the performance of the display.

As examples, active area AA includes emissive sub-pixels 62-1, 62-2, 62-3, and 62-4. Emissive sub-pixel 62-1 is controlled by a thin-film transistor sub-pixel 64-1 that it does not vertically overlap. Emissive sub-pixel 62-1 is electrically connected to thin-film transistor sub-pixel 64-1 by a respective conductive path 76. Emissive sub-pixel 62-2 is controlled by a thin-film transistor sub-pixel 64-2 that it does not vertically overlap. Emissive sub-pixel 62-2 is electrically connected to thin-film transistor sub-pixel 64-2 by a respective conductive path 76. Emissive sub-pixel 62-3 is controlled by a thin-film transistor sub-pixel 64-3 that it does not vertically overlap. Emissive sub-pixel 62-3 is electrically connected to thin-film transistor sub-pixel 64-3 by a respective conductive path 76. Emissive sub-pixel 62-4 is controlled by a thin-film transistor sub-pixel 64-4 that it does not vertically overlap. Emissive sub-pixel 62-4 is electrically connected to thin-film transistor sub-pixel 64-4 by a respective conductive path 76.

Decoupling the position of the thin-film transistor sub-pixels and the emissive sub-pixels and increasing the density of the thin-film transistor sub-pixels relative to the emissive sub-pixels allows for gate driver circuitry 20B-2 to overlap the active area AA. As shown in FIG. 6A, gate driver circuitry 20B-2 extends into active area AA by distance 34. An additional portion of the gate driver circuitry having width 36 is formed in the inactive area of the display.

FIG. 6B is a cross-sectional side view of the display shown in FIG. 6A. As shown in FIG. 6B, thin-film transistor sub-pixels 64 are formed within substrate 26. Substrate 26 may include one or more dielectric layers (such as layers 26-1 and 26-2) and metallization layers that form the thin-film transistor circuitry that operates the display. Thin-film transistor sub-pixels 64 are formed on dielectric layer 26-2.

Each thin-film transistor sub-pixel 64 is electrically connected to and controls a respective emissive sub-pixel 62. In the example of FIG. 6B, each emissive sub-pixel 62 includes a respective anode 68 and OLED layers 70. This example is merely illustrative. In general, each emissive sub-pixel may be formed using any desired type of display technology (e.g., OLED, LED, LCD, etc.).

As shown in FIG. 6B, conductive paths 76 allow for each emissive sub-pixel 62 to not necessarily vertically overlap the respective thin-film transistor sub-pixel 64 by which it is controlled. Some of the emissive sub-pixels are shifted laterally relative to their controlling thin-film transistor sub-pixel.

Each conductive path 76 may be formed from any desired metal layers within the display. Metal layers that are already present in the display for other functions may be patterned to include portions that help form the conductive paths. For example, a metal layer may be patterned to form gate lines, data lines, a pixel anode, a power supply line, and/or another desired display component in addition to forming at least a part of conductive path 76.

When the thin-film transistor sub-pixels have a higher density than the emissive sub-pixels (as in FIGS. 6A and 6B), space may be vacated within the substrate for additional components such as gate driver circuitry 20B-2 and/or data lines in a fanout region. As shown in FIG. 6B, gate driver circuitry 20B-2 is formed underneath some of the emissive sub-pixels at the periphery of active area AA. Gate driver circuitry (such as circuitry 20B-1 or circuitry 20B-2 in FIG. 6B) may be formed using integrated circuits or thin-film transistor circuitry.

The example in FIG. 6B of gate driver circuitry 20B-2 being formed under emissive sub-pixels at the edge of the active area is merely illustrative. Other electronic components (e.g., gate driver circuitry 20B-1, data lines for a fanout region, display driver circuitry 20A, a light emitter for a sensor such as a proximity sensor, etc.) may be formed under emissive sub-pixels if desired. Additionally, in FIG. 6B, the area of the active area that is devoid of thin-film transistor sub-pixels extends along an edge of the active area (e.g., the right edge of the active area in FIG. 4). However, this example is merely illustrative. In general, any desired portion of the active area may be free from thin-film transistor sub-pixels in order to accommodate an additional component. For example, the left and/or right edge of the active area may be free from thin-film transistor sub-pixels to accommodate gate driver circuitry, the lower-right and/or lower-left rounded corners of the active area may be free from thin-film transistor sub-pixels to accommodate data lines in a fanout region, and/or the top and/or bottom edge of the active area may be free from thin-film transistor sub-pixels to accommodate display driver circuitry (e.g., circuitry 20A in FIG. 4). As yet another example, an area free from thin-film transistor sub-pixels may be positioned in a central portion of the active area such that the thin-film-transistor-sub-pixel-free region is an island that is laterally surrounded by the thin-film transistor sub-pixels. This type of island that is free from thin-film transistor sub-pixels may accommodate a light emitter.

Figure 7:
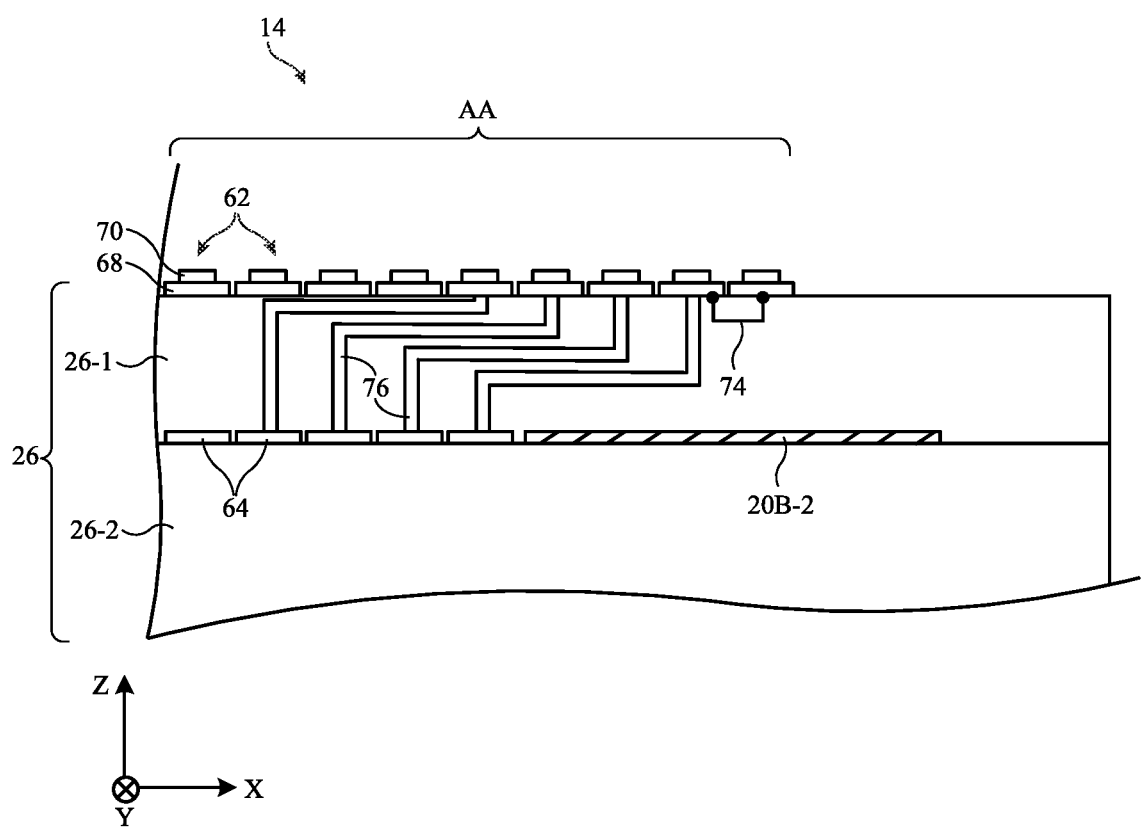
FIG. 7 is a cross-sectional side view of an illustrative display with emissive sub-pixels having shorted anodes that are shifted laterally relative to respective thin-film transistor sub-pixels in accordance with some embodiments.

If desired, as shown in FIG. 7, multiple anodes 68 may be shorted together (e.g., by a conductive path such as conductive path 74). The shorted anodes may be positioned in a TFT-free zone (e.g., overlapping gate driver circuitry 20B-2 as in FIG. 7 or another desired component). Emissive sub-pixels with shorted anodes may also optionally overlap thin-film transistor sub-pixels if desired.

Shorting the anodes of multiple emissive sub-pixels allows for a single thin-film transistor sub-pixel to control multiple emissive sub-pixels, which reduces the number of thin-film transistor sub-pixels required for the display. In one possible arrangement, adjacent emissive sub-pixels of the same color may have anodes that are shorted together.

Figure 8:
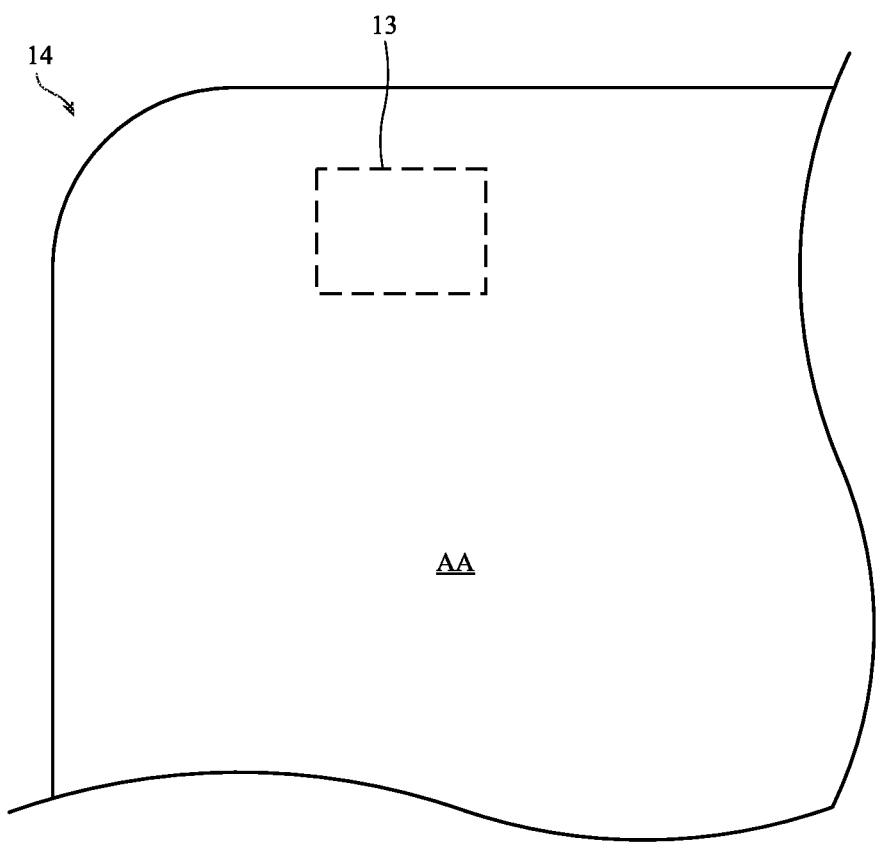
FIG. 8 is a top view of an illustrative display with an active area that overlaps a sensor with a light source in accordance with some embodiments.

As shown in FIG. 8, device 10 may include a sensor 13 mounted behind display 14 (e.g., behind the active area of the display). FIG. 8 is a top view of an illustrative display 14 with a sensor 13 mounted behind the active area (AA) of the display. Sensor 13 may sometimes include a light-emitting component in addition to a sensor component. As one illustrative example, sensor 13 may be a proximity sensor that includes a light source in addition to a light sensor. The light source is configured to emit light through the active area of the display from underneath the active area of the display. The light sensor is configured to sense reflections of the emitted light that pass through the active area of the display to the light sensor. The light source may emit light in a series of pulses at a desired frequency. Each pulse has a desired duration. The properties of the pulses (e.g., frequency, duration, wavelength, intensity, etc.) may sometimes be referred to as a firing mode for the emitter.

To mitigate the impact of sensor 13 on the operation of display 14, sensor 13 may include a light emitter that operates using non-visible-wavelength light. For example, sensor 13 may include an infrared (IR) light emitter or an ultraviolet (UV) light emitter and may have a corresponding light sensor (e.g., an IR light sensor for an IR light emitter or a UV light sensor for a UV light emitter). Using a light emitter that operates using non-visible-wavelength light may prevent the light emitted by the light emitter from being directly observed by a viewer of display 14. However, the light emitter may still cause visible artifacts in display 14.

As previously mentioned, display 14 includes thin-film transistor circuitry that may include polysilicon thin-film transistors, semiconducting-oxide thin-film transistors such as indium zinc gallium oxide (IGZO) transistors, and/or thin-film transistors formed from other semiconductors. Additionally, display 14 may include one or more organic layers that form organic light-emitting diode pixels in an organic light-emitting diode display. One or more materials in the thin-film transistor circuitry and the organic layers that form pixels 22 may be photosensitive to non-visible-wavelength light. Accordingly, even if sensor 13 includes a light emitter that uses non-visible-wavelength light, emissions of the non-visible-wavelength light may cause display artifacts in the localized region of the display that overlaps the light emitter.

Display artifacts caused by emission of the light emitter in sensor 13 may include causing a region of the display over the light emitter to have a different brightness or color than the surrounding portions of the display. The artifacts may be static or may be transient (e.g., may rapidly appear and disappear so as to have the appearance of blinking). The artifacts may be more visible in a dark ambient light environment than in a bright ambient light environment.

The majority of the artifacts caused by interactions between the non-visible-light emitter and the display may be caused by interaction between the non-visible-light and the thin-film transistors of the thin-film transistor sub-pixels. Therefore, to mitigate artifacts caused by the light emitter in sensor 13, the display may have an area that is free of thin-film transistor sub-pixels (but still includes emissive sub-pixels), sometimes referred to as a TFT-free region or TFT-free zone. The light emitter emits light through the TFT-free region. This allows for the emissive sub-pixel resolution to be undisturbed across the active area (so that the display has a uniform appearance), minimizes the border requirements for the electronic device (because the sensor 13 is positioned underneath the active area of the display instead of occupying additional room outside of the display), and mitigates artifacts caused by the light emitter such that the light emitter is not detectable to the viewer.

Figure 9:
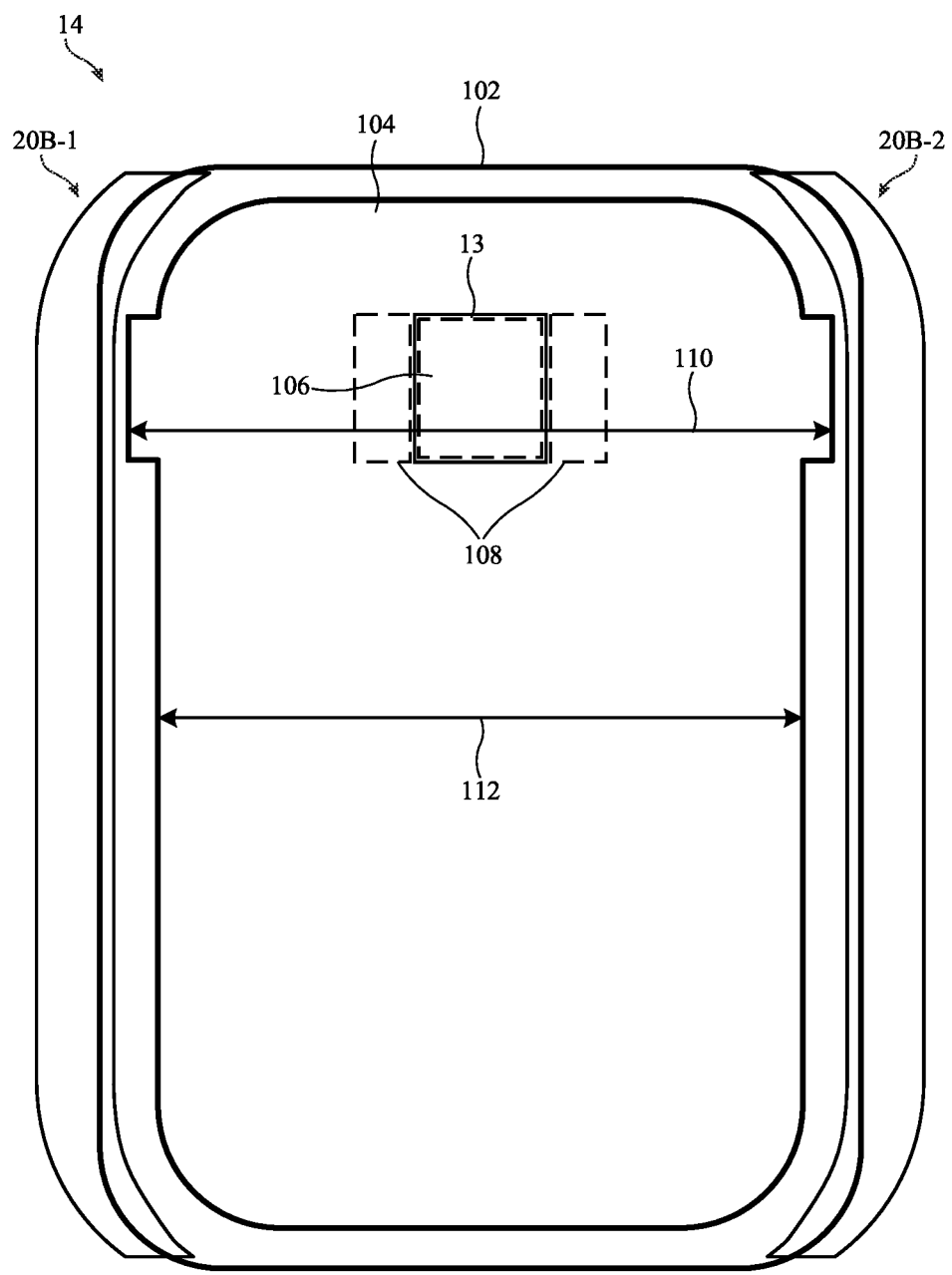
FIGS. 9 and 10 are top views of an illustrative display with a portion having thin-film transistor sub-pixels with a uniform density and a region that is free of thin-film transistor sub-pixels in accordance with some embodiments.

FIG. 9 is a top view of an illustrative display with a TFT-free zone that overlaps a sensor 13 (with a light emitter). As shown in FIG. 9, display 14 includes an array of emissive sub-pixels distributed across an area 102. The emissive sub-pixels have a uniform density and uniform distribution across area 102. In the example of FIG. 9, area 102 has four sides with rounded corners. This example is merely illustrative. Area 102 is the active area AA for the display, and the active area may have any desired footprint.

The thin-film transistor sub-pixels are formed in an area 104. The density of the thin-film transistor sub-pixels is greater than the density of the emissive sub-pixels. Therefore, the total footprint of area 104 is smaller than the total footprint of area 102. The smaller footprint 104 allows for additional components such as gate driver circuitry 20B-1 and gate driver circuitry 20B-2 to be formed in the active area at the edges of the active area. Additionally, area 104 has a TFT-free zone 106 (e.g., an island that is laterally surrounded by area 104) that accommodates sensor 13. A light emitter may emit light through TFT-free zone 106.

In FIG. 9, the thin-film transistor sub-pixels that control the emissive sub-pixels within TFT-free zone 106 are consolidated in regions 108 that are adjacent to the TFT-free zone 106 and within the same pixel rows as the TFT-free zone. Because the thin-film transistor sub-pixels have a uniform density, area 104 has a larger width 110 in rows that include TFT-free zone 106 than the width 112 in rows that do not include TFT-free zone 106. Width 110 may be larger than width 112 by at least 0.1%, at least 0.5%, at least 1%, at least 5%, at least 10%, etc.

In other words, the thin-film transistor sub-pixels in region 108 are laterally shifted relative to the emissive sub-pixels in TFT-free zone 106 that they control. This arrangement is similar to as shown in FIGS. 6A and 6B, except with substituting sensor 13 (and its light emitter) for the gate driver circuitry 20B-2 as the component overlapped by the emissive sub-pixels in the TFT-free zone.

Figure 10:
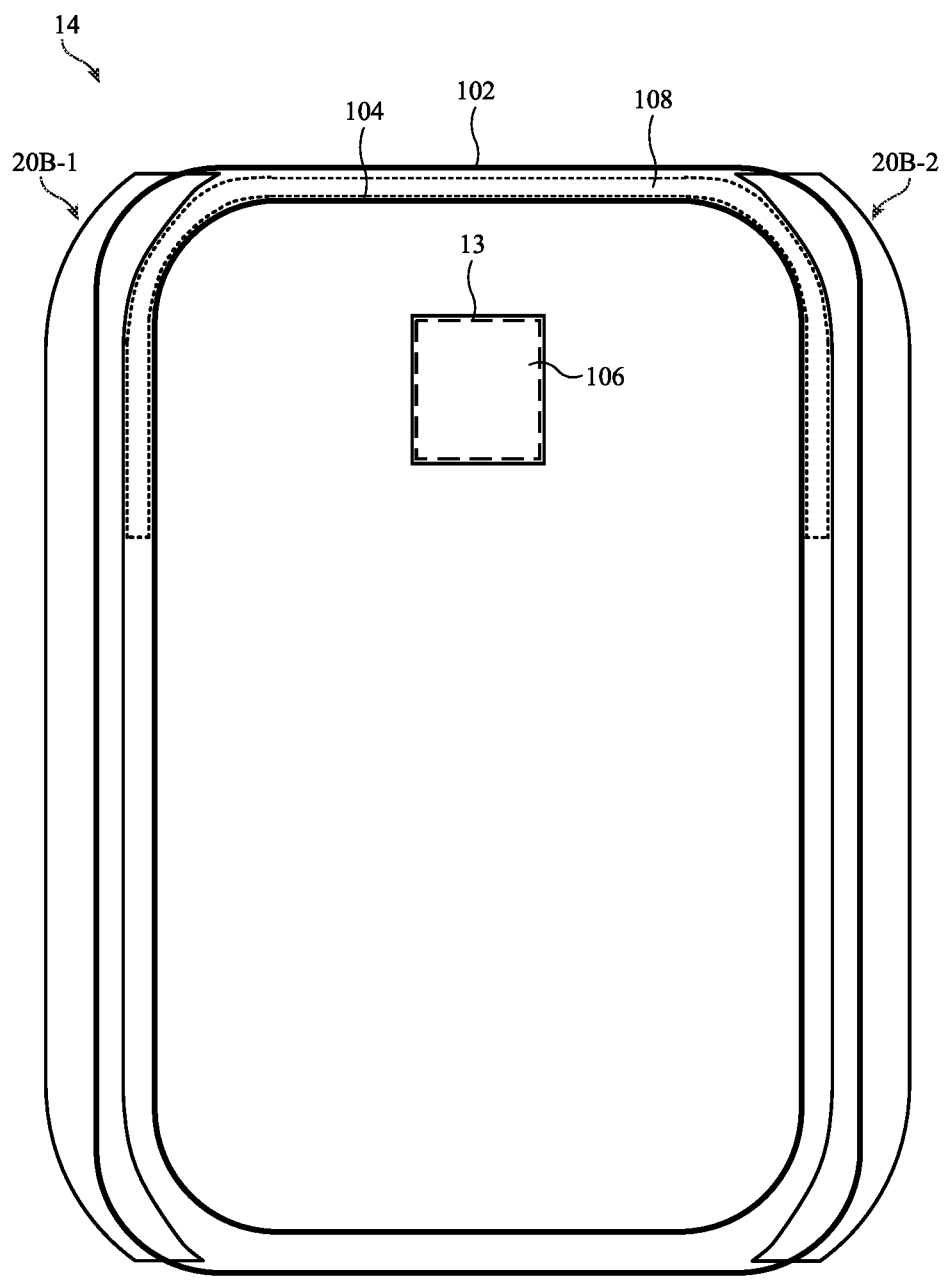

The example in FIG. 9 of region 108 (with the TFT sub-pixels that control the emissive sub-pixels in TFT-free zone 106) being positioned adjacent to TFT-free zone 106 is merely illustrative. In another possible arrangement, shown in FIG. 10, region 108 with the TFT sub-pixels that control the emissive sub-pixels in TFT-free zone 106 is not adjacent to TFT-free zone 106. In other words, TFT sub-pixels for emissive sub-pixels outside of TFT-free zone 106 may be interposed between TFT-free zone 106 and TFT sub-pixels for emissive sub-pixels within the TFT-free zone.

Figure 11:
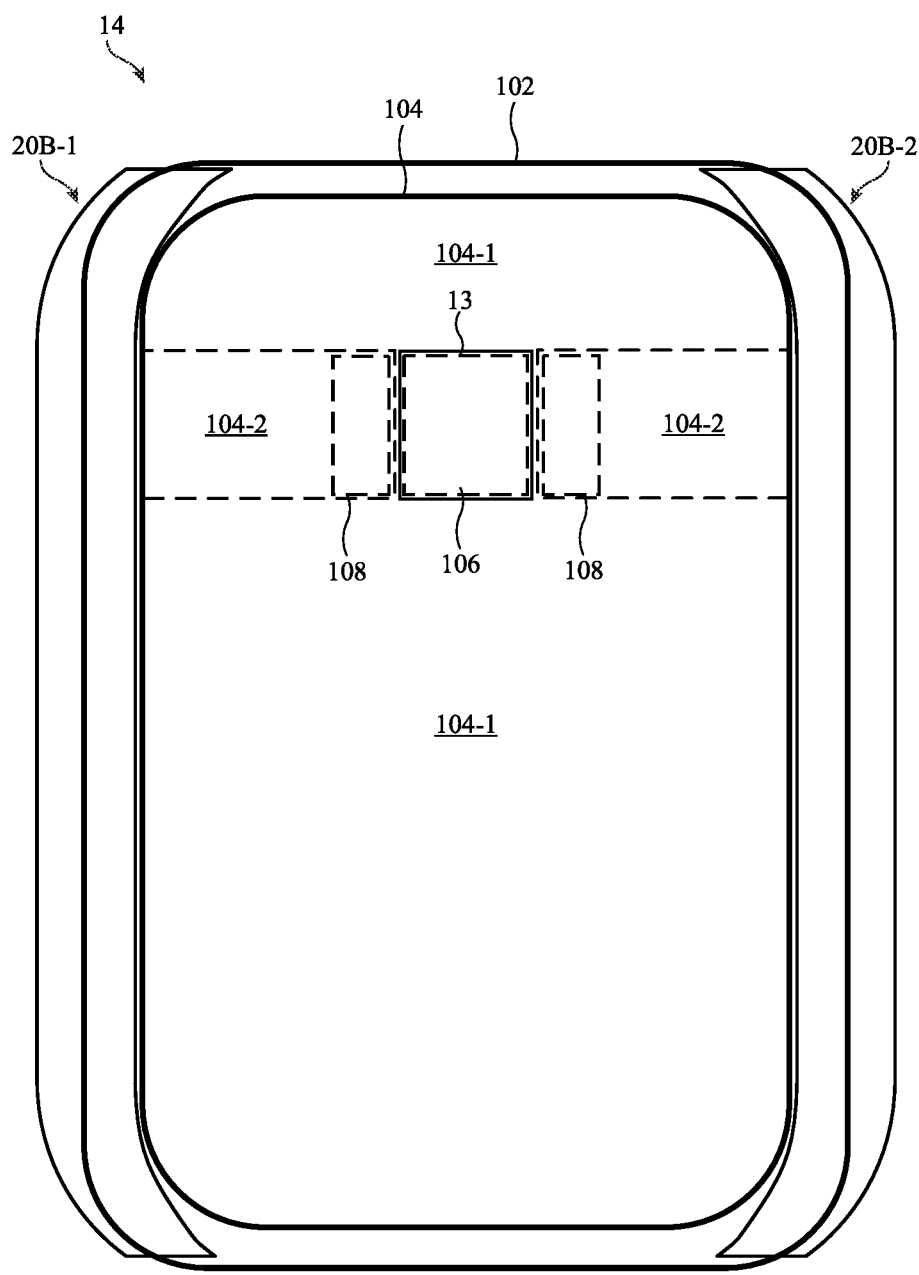
FIG. 11 is a top view of an illustrative display with different portions having different densities of thin-film transistor sub-pixels and a region that is free of thin-film transistor sub-pixels in accordance with some embodiments.

In yet another possible arrangement, the TFT sub-pixels have different regions with different densities. As shown in FIG. 11, the TFT sub-pixels may have a first portion 104-1 with a first density (number of TFT sub-pixels per unit area) that is higher than the density of the emissive sub-pixels. The TFT sub-pixels also have second portions 104-2 with a second density that is higher than the first density for portion 104-1. As shown, second portions 104-2 are aligned with TFT-free zone 106 (e.g., rows that include TFT-free zone 106 are part of second portion 104-2).

This type of arrangement allows for the TFT footprint 104 to have a uniform width both in portions that include TFT-free zone 106 and in portions that do not include TFT-free zone 106 (unlike in FIG. 9, where an increased width is caused by the TFT-free zone).

The density of the thin-film transistor sub-pixels in portion 104-2 may be greater than the density of the thin-film transistor sub-pixels in portion 104-1 by at least 0.1%, by at least 0.5%, by at least 1%, by at least 2%, by at least 3%, by at least 5%, by at least 10%, etc.

In FIG. 11, similar to as in FIG. 9, the thin-film transistor sub-pixels that control the emissive sub-pixels within TFT-free zone 106 are consolidated in regions 108 that are adjacent to the TFT-free zone and within the same pixel rows as the TFT-free zone.

Figure 12:
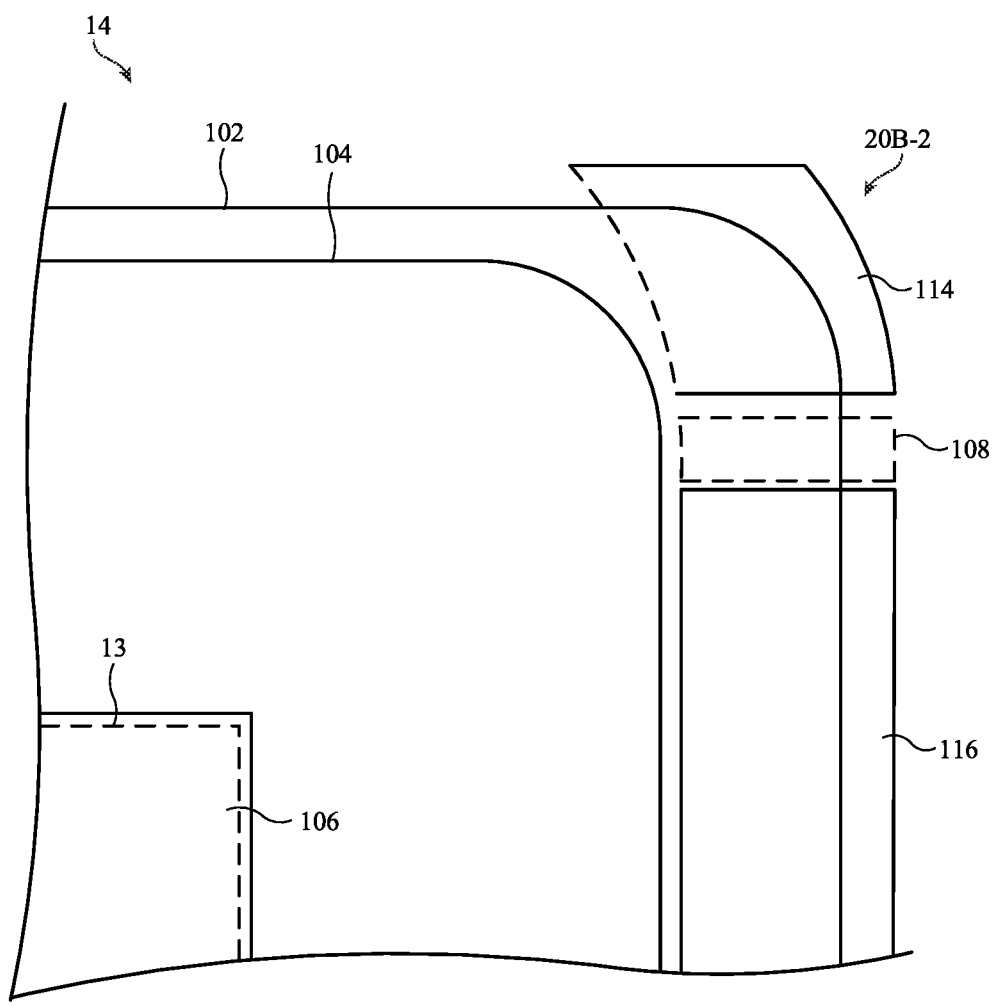
FIG. 12 is a top view of an illustrative display with at least some thin-film transistor sub-pixels interposed between first and second portions of gate driver circuitry in accordance with some embodiments.

In some cases, gate driver circuitry 20B may include one or more dummy components. The dummy components may be used to equalize loading and improve uniformity. If desired, as shown in FIG. 12, the thin-film transistor sub-pixels that control the emissive sub-pixels within TFT-free zone 106 may be positioned in region 108 in place of the dummy components of gate driver circuitry 20B. Consequently, region 108 with the thin-film transistor sub-pixels that control the emissive sub-pixels within TFT-free zone 106 is interposed between a first portion 114 of the gate driver circuitry 20B-2 and a second portion 116 of the gate driver circuitry 20B-2. The thin-film transistor sub-pixels in region 108 may equalize loading and improve uniformity similar to the dummy components of the gate driver circuitry. However, using thin-film transistor sub-pixels in region 108 instead of dummy components may be a more optimal use of footprint within the display.

Figure 13:
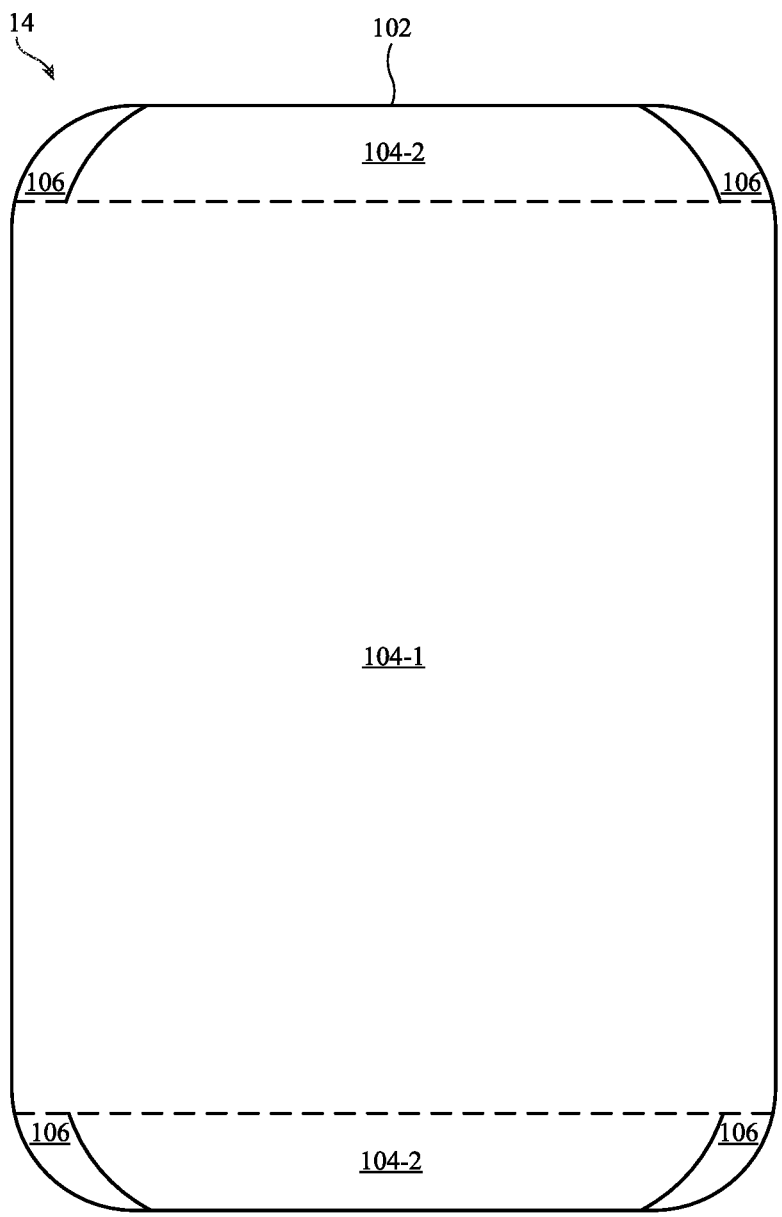
FIG. 13 is a top view of an illustrative display with regions that are free of thin-film transistor sub-pixels in rounded corners in accordance with some embodiments.

In the example of FIG. 9, the density of the thin-film transistor sub-pixels is increased across all of the footprint 104 for the thin-film transistor sub-pixels. This allows for gate driver circuitry 20B to overlap the active area along the entire left and right edges of the display. This example is merely illustrative. The rounded corners of the display may be a limiting factor in the inactive border requirements for the display. Accordingly, in another possible arrangement, shown in FIG. 13, the thin-film transistor sub-pixels have a first portion 104-1 in which the density of the thin-film transistor sub-pixels is the same as the density of the emissive sub-pixels. Accordingly, the gate driver circuitry does not overlap the active area in portion 104-1. However, the thin-film transistor sub-pixels have second portions 104-2 at the top and bottom of the display in which the density of the thin-film transistor sub-pixels is greater than the density of the emissive sub-pixels (e.g., by at least 0.1%, by at least 0.5%, by at least 1%, by at least 2%, by at least 3%, by at least 5%, by at least 10%, etc.). The thin-film transistor sub-pixels are consolidated in the center of the display in portions 104-2 such that there are TFT-free zones 106 in each of the four rounded corners of the active area. The TFT-free zones in the rounded corners may be used to accommodate additional components such as gate driver circuitry.

If care is not taken, a light source that operates through the display may cause heating in the thin-film transistor sub-pixels that damages the thin-film transistor sub-pixels. To mitigate heating that causes damage in the display, the display may include a transparent (to the type of light emitted by the light source) and heat spreading layer over the light source or a patterned layer that does not transmit the light from the light source.

Figure 14:
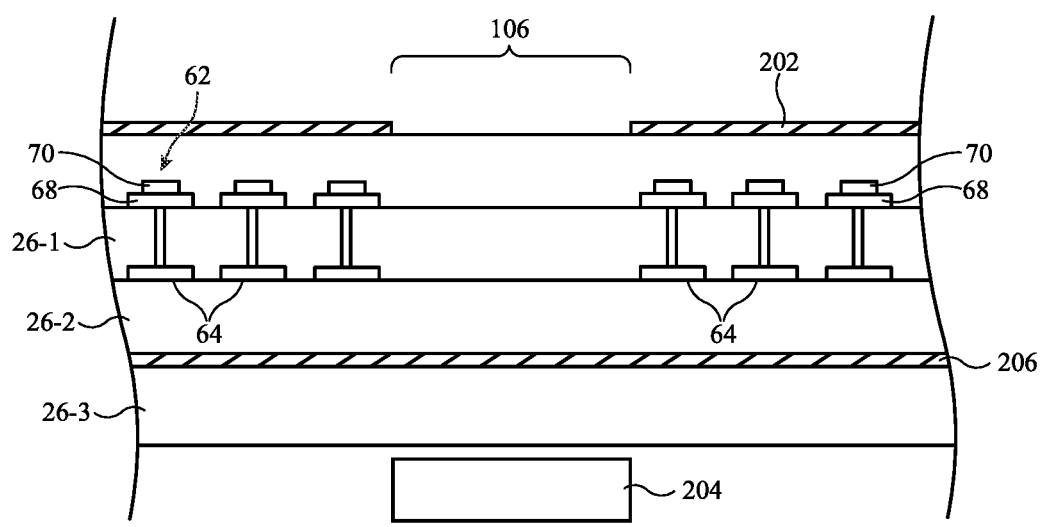
FIG. 14 is a cross-sectional side view of an illustrative display with a heat spreading layer that overlaps a light source underneath the display in accordance with some embodiments.

FIG. 14 is a cross-sectional side view of a display with a heat spreading layer. As shown, heat spreading layer 206 may be interposed between adjacent layers 26-2 and 26-3 of the display substrate. Each one of dielectric layers 26-1, 26-2, and 26-3 may be formed from polyimide, as one example. The thin-film transistor sub-pixels 64 are removed in TFT-free zone 106 as previously discussed. Although not explicitly shown in FIG. 14, the TFT-free zone 106 may include emissive sub-pixels 62 as discussed in connection with FIG. 9.

Light source 204 (e.g., an infrared laser that is part of sensor 13) may be positioned under TFT-zone 106 and emits light through TFT-zone 106. However, the infrared light emitted by light source 204 may cause heat that damages thin-film transistor sub-pixels 64. Heat spreading layer 206 (which may be formed from a conductive material) may have a high thermal conductivity (e.g., greater than 0.2 $Wm^{-1}K^{-1}$, greater than 0.5 $Wm^{-1}K^{-1}$, greater than 1.0 $Wm^{-1}K^{-1}$, etc.) that spreads the heat within the display and prevents damage within the display. So as to not adversely affect performance of sensor 13, heat spreading layer 206 may have a high transparency to light at the wavelength emitted by light source 204. For example, when light source 204 emits infrared light, heat spreading layer 206 may have a high transparency to infrared light (e.g., greater than 80%, greater than 90%, greater than 95%, etc.). Heat spreading layer 206 may be formed from indium tin oxide or any other desired material.

FIG. 14 also shows how the display may include a cathode 202 for the pixels in the display. As shown in FIG. 14, cathode 202 may be removed in TFT-free zone 106 to improve the transmission of light by light source 204 through the display in TFT-free zone 106.

Figure 15:
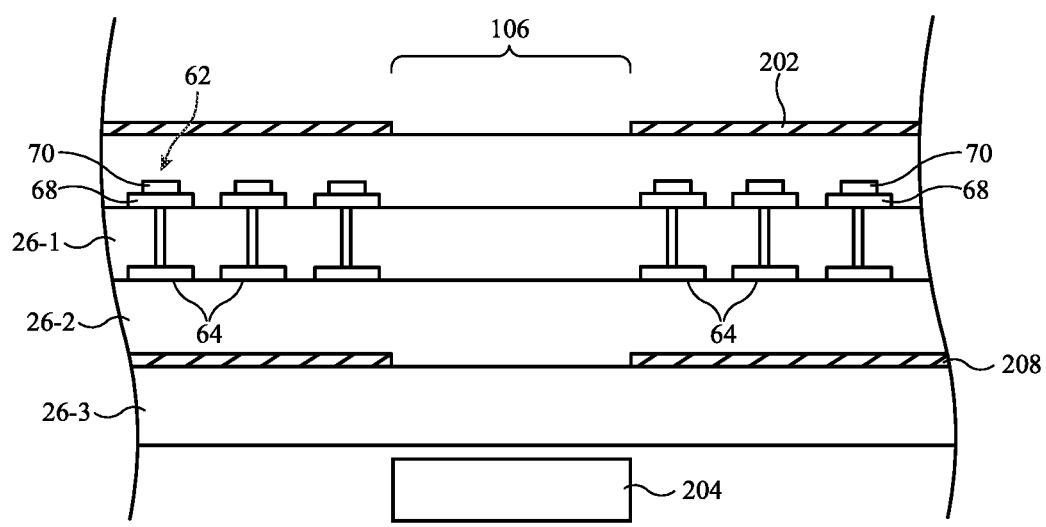
FIG. 15 is a cross-sectional side view of an illustrative display with a light blocking metal layer that blocks light from a light source underneath the display in accordance with some embodiments.

In another possible arrangement, shown in FIG. 15, a patterned light blocking metal layer 208 is formed between substrate layers 26-2 and 26-3. The light blocking metal layer 208 may block or reflect light from light source 204, thus preventing the light from reaching sensitive components in the display such as thin-film transistor sub-pixels 64. The light blocking metal layer may have a low transparency to light at the wavelength emitted by light source 204. For example, when light source 204 emits infrared light, light blocking metal layer 208 may have a low transparency to infrared light (e.g., less than 20%, less than 10%, less than 5%, etc.). The light blocking metal layer 208 is patterned to have an opening that is aligned with TFT-free zone 106. Some light from light source 204 may therefore pass through the opening in light blocking metal layer 208 (and the rest of the display) while the light blocking metal layer 208 blocks the light from reaching sensitive components in the display.

Figure 16:
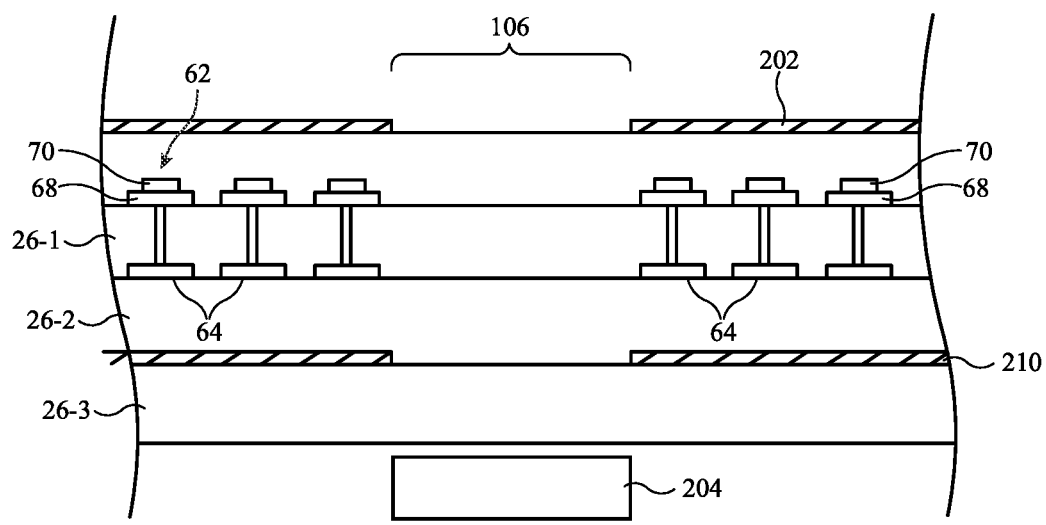
FIG. 16 is a cross-sectional side view of an illustrative display with an inorganic reflector layer that blocks light from a light source underneath the display in accordance with some embodiments.

In yet another possible arrangement, shown in FIG. 16, a patterned inorganic reflector layer 210 is formed between substrate layers 26-2 and 26-3. The inorganic reflector layer 210 may block light from light source 204 from reaching sensitive components in the display such as thin-film transistor sub-pixels 64. The inorganic reflector layer may have a low transparency to light at the wavelength emitted by light source 204. For example, when light source 204 emits infrared light, inorganic reflector layer 210 may have a low transparency to infrared light (e.g., less than 20%, less than 10%, less than 5%, etc.). The inorganic reflector layer 210 is patterned to have an opening that is aligned with TFT-free zone 106. Some light from light source 204 may therefore pass through the opening in inorganic reflector layer 210 (and the rest of the display) while the inorganic reflector layer 210 blocks the light from reaching sensitive components in the display.

The example in FIGS. 14-16 of layers 206-210 being formed between layers of polyimide is merely illustrative. In general, layers 206-210 may be formed at any desired position within the display stack (e.g., underneath a bottom substrate layer, between substrate layer 26-2 and thin-film transistor sub-pixels 64, etc.).

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a plurality of pixels arranged in a light-emitting area, wherein each one of the plurality of pixels includes an emissive sub-pixel and a thin-film transistor sub-pixel that controls the emissive sub-pixel, wherein the emissive sub-pixels have a first number of emissive sub-pixels per unit area, wherein the thin-film transistor sub-pixels have a second number of thin-film transistor sub-pixels per unit area, and wherein the second number is greater than the first number;
   a region in the plurality of pixels that includes a first subset of the emissive sub-pixels and is free of any thin-film transistor sub-pixels, wherein a second subset of the thin-film transistor sub-pixels outside of the region controls the first subset of the emissive sub-pixels that is in the region;
   gate driver circuitry that is positioned at an edge of the light-emitting area, wherein the second subset of the thin-film transistor sub-pixels includes at least one thin-film transistor sub-pixel that is interposed between first and second portions of the gate driver circuitry; and
   a light source that emits light through the region in the plurality of pixels.

2. The electronic device defined in claim 1, further comprising a third subset of the thin-film transistor sub-pixels that is interposed between the first subset of the emissive sub-pixels and the second subset of the thin-film transistor sub-pixels.

3. The electronic device defined in claim 1, wherein the second subset of the thin-film transistor sub-pixels includes at least one thin-film transistor sub-pixel that is adjacent to a periphery of the light-emitting area.

4. The electronic device defined in claim 1, wherein the thin-film transistor sub-pixels have a first portion that has the second number of thin-film transistor sub-pixels per unit area and a second portion that has a third number of thin-film transistor sub-pixels per unit area.

5. The electronic device defined in claim 4, wherein the first portion overlaps the region in a first direction and wherein the second portion does not overlap the region in the first direction.

6. The electronic device defined in claim 1, further comprising:
   a plurality of data lines;
   a plurality of gate lines;
   display driver circuitry that is configured to provide data to the plurality of pixels using the plurality of data lines, wherein at least a portion of the gate driver circuitry is positioned in the light-emitting area.

7. The electronic device defined in claim 6, wherein a second subset of the emissive sub-pixels overlaps the gate driver circuitry and wherein a third subset of the thin-film transistor sub-pixels controls the second subset of the emissive sub-pixels.

8. The electronic device defined in claim 7, wherein the third subset of the thin-film transistor sub-pixels does not overlap the gate driver circuitry.

9. The electronic device defined in claim 8, wherein the thin-film transistor sub-pixels are arranged in an area and wherein the third subset of the thin-film transistor sub-pixels is consolidated at an edge of the area.

10. The electronic device defined in claim 1, wherein the light source is an infrared light source.

11. The electronic device defined in claim 1, wherein the emissive sub-pixels have a uniform density across the light-emitting area.

12. The electronic device defined in claim 11, wherein the thin-film transistor sub-pixels have a non-uniform density across the light-emitting area.

13. The electronic device defined in claim 1, wherein each emissive sub-pixel includes a respective anode and wherein the anodes of at least some of the first subset of the emissive sub-pixels are shorted to at least one additional anode.

14. The electronic device defined in claim 1, further comprising:
a heat spreading layer that is interposed between the light source and the plurality of pixels, wherein the heat spreading layer is transparent to the light emitted by the light source.

15. The electronic device defined in claim 1, further comprising:
a metal layer that is interposed between the light source and the plurality of pixels, wherein the metal layer blocks the light emitted by the light source and wherein the metal layer has an opening that overlaps the light source.

16. The electronic device defined in claim 1, further comprising:
an inorganic reflector layer that is interposed between the light source and the plurality of pixels, wherein the inorganic reflector layer blocks the light emitted by the light source and wherein the inorganic reflector layer has an opening that overlaps the light source.

17. A display comprising:
a plurality of pixels arranged in a light-emitting area, wherein the light-emitting area has rounded corners, wherein each one of the plurality of pixels includes an emissive sub-pixel and a thin-film transistor sub-pixel that controls the emissive sub-pixel, and wherein the emissive sub-pixels have a uniform density across the light-emitting area;
a plurality of data lines;
a plurality of gate lines;
display driver circuitry that is configured to provide data to the plurality of pixels using the plurality of data lines; and
gate driver circuitry that is configured to provide control signals to the plurality of pixels using the plurality of gate lines, wherein, in a first subset of rows of the emissive sub-pixels that includes the rounded corners, the emissive sub-pixels overlap the gate driver circuitry along an edge of the light-emitting area, and wherein, in a second subset of rows of the emissive sub-pixels that does not include the rounded corners, the emissive sub-pixels do not overlap the gate driver circuitry along the edge of the light-emitting area.

18. The electronic device defined in claim 17, wherein the first subset of rows of the emissive sub-pixels has the uniform density and wherein the second subset of rows of the emissive sub-pixels has the uniform density.

19. An electronic device comprising:
a display comprising a plurality of pixels arranged in a light-emitting area, wherein each one of the plurality of pixels includes an emissive sub-pixel and a thin-film transistor sub-pixel that controls the emissive sub-pixel, wherein the emissive sub-pixels have a uniform density across the light-emitting area, wherein the thin-film transistor sub-pixels have a first portion with a first number of thin-film transistor sub-pixels per unit area and a second portion with a second number of thin-film transistor sub-pixels per unit area, wherein the first portion is adjacent to the second portion, and wherein the second number is different than the first number; and
a proximity sensor comprising a light source that emits light through a portion of the plurality of pixels that is free of thin-film transistor sub-pixels.

20. The electronic device defined in claim 19, wherein the display further comprises:
a plurality of data lines;
a plurality of gate lines;
display driver circuitry that is configured to provide data to the plurality of pixels using the plurality of data lines; and
gate driver circuitry that is configured to provide control signals to the plurality of pixels using the plurality of gate lines, wherein at least a portion of the gate driver circuitry is positioned in the light-emitting area.

21. The electronic device defined in claim 19, wherein the thin-film transistor sub-pixels have a third portion with a third number of thin-film transistor sub-pixels per unit area, and wherein the first and third portions of thin-film transistor sub-pixels are separated by the portion of the plurality of pixels that is free of thin-film transistor sub-pixels.

22. The electronic device defined in claim 19, wherein the second number is greater than the first number.

23. The electronic device defined in claim 19, wherein the second portion of the thin-film transistor sub-pixels is aligned with the portion of the plurality of pixels that is free of thin-film transistor sub-pixels.

* * * * *